US008400153B2

(12) United States Patent
Evers et al.

(10) Patent No.: US 8,400,153 B2
(45) Date of Patent: Mar. 19, 2013

(54) MOULDED CABLE TRAPS

(75) Inventors: Matheus Jacobes Maria Evers, Best (NL); Laurens Cornelis Van Leeuwen, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 890 days.

(21) Appl. No.: 12/374,854

(22) PCT Filed: Jul. 24, 2007

(86) PCT No.: PCT/IB2007/052933
§ 371 (c)(1),
(2), (4) Date: Jan. 23, 2009

(87) PCT Pub. No.: WO2008/012761
PCT Pub. Date: Jan. 31, 2008

(65) Prior Publication Data
US 2009/0315642 A1 Dec. 24, 2009

Related U.S. Application Data

(60) Provisional application No. 60/820,247, filed on Jul. 25, 2006.

(51) Int. Cl.
*G01V 3/00* (2006.01)

(52) U.S. Cl. ........................................ 324/322; 324/318

(58) Field of Classification Search .......... 324/300–322; 600/439, 374; 174/110 R, 113 R, 28, 27, 174/116
See application file for complete search history.

(56) References Cited

U.S. PATENT DOCUMENTS

| 4,682,125 | A | * | 7/1987 | Harrison et al. ................. 333/12 |
| 4,782,298 | A | * | 11/1988 | Arakawa et al. ............... 324/322 |
| 5,208,568 | A | | 5/1993 | Sassin |
| 5,631,443 | A | | 5/1997 | Scrimpshire |
| 5,742,165 | A | | 4/1998 | Snelten et al. |
| 5,844,171 | A | | 12/1998 | Fitzgerald |
| 6,004,269 | A | * | 12/1999 | Crowley et al. ................ 600/439 |
| 6,091,025 | A | * | 7/2000 | Cotter et al. ............... 174/110 R |
| 6,302,740 | B1 | * | 10/2001 | Holmstrom .............. 439/607.41 |
| 6,605,775 | B1 | | 8/2003 | Seeber et al. |
| 6,664,465 | B2 | | 12/2003 | Seeber |
| 6,670,863 | B2 | | 12/2003 | Van Helvoort |
| 6,982,378 | B2 | * | 1/2006 | Dickson .......................... 174/36 |
| 7,301,098 | B2 | * | 11/2007 | Bolouri-Saransar et al. ... 174/36 |
| 7,599,729 | B2 | * | 10/2009 | Atalar et al. .................. 600/423 |
| 8,195,295 | B2 | * | 6/2012 | Stevenson et al. ............. 607/36 |
| 2002/0125034 | A1 | | 9/2002 | Kuo |
| 2008/0129295 | A1 | * | 6/2008 | Carlton ......................... 324/318 |
| 2009/0021261 | A1 | * | 1/2009 | Chmielewski et al. ........ 324/322 |
| 2010/0219347 | A1 | * | 9/2010 | Schulz et al. ............. 250/363.04 |
| 2010/0238362 | A1 | * | 9/2010 | Hughes et al. ................ 348/738 |
| 2012/0262250 | A1 | * | 10/2012 | Stevenson et al. ............ 333/167 |

FOREIGN PATENT DOCUMENTS

| EP | 1311146 A2 | 5/2003 |
| EP | 1469485 A2 | 10/2004 |

\* cited by examiner

*Primary Examiner* — Brij Shrivastav

(57) ABSTRACT

An overmoulded cable trap (302) for improved performance of an RF trap (102) is disclosed, wherein the RF trap (102) is placed on a section of an electrical cable (104) and fixed in position by overmoulding a thermoplastic material over both the RF trap (102) and the section of the electrical cable (104). The overmoulded cable trap (302) disclosed herein provides an RF trap (102) that has better shock protection, increased resistance to moisture, improved smoothness, is easier to handle and clean, is cheaper, can be created in very small packages where space is limited, can be easily sized to a range of diameters and lengths, is more reliable with respect to maximum rated voltage and less electromagnetic coupling to the environment, and generates less heat, than other designs of RF traps.

17 Claims, 5 Drawing Sheets

MOULDED CABLE TRAPS

CROSS REFERENCE TO RELATED APPLICATIONS

This application claims the benefit of U.S. provisional application serial no. 60/820,247 filed Jul. 25, 2006, which is incorporated herein by reference.

FIELD OF THE INVENTION

The invention relates to a radio-frequency (RF) trap for suppressing electromagnetic (EM) coupling phenomena in a cable used for conducting electric currents, particularly for RF alternating currents in a magnetic resonance (MR) apparatus.

BACKGROUND OF THE INVENTION

U.S. Pat. No. 6,605,775B1 discusses a method of reducing shield currents, i.e., currents in the shield of an electrical cable (for example, a coaxial cable) using a "floating" RF trap, i.e. an RF trap that is not electrically attached to the electrical cable. The RF trap may be easily added (or removed) from the electrical cable and also adjusted in position along the length of the electrical cable. As the effectiveness of the RF trap in suppressing shield currents is determined by its location on the electrical cable, for example, the distance of the RF trap from the ends of the electrical cable and to other RF traps, such a "floating" RF trap may not deliver consistent performance if its position on the electrical cable is changed. Thus, for reliable operation of the RF trap, it is desirable to have an electrical cable on which the position of the RF trap is fixed.

SUMMARY OF THE INVENTION

Accordingly, an electrical-cable setup in which the position of an RF trap is fixed on a section of an electrical cable by a process of overmoulding is disclosed herein. The RF trap is placed around a section of the electrical cable and fixed in position by overmoulding a thermoplastic material over both the RF trap and the section of the electrical cable. Such a combination of an RF trap and a section of an electrical cable formed by the overmoulding process is henceforth referred to as an overmoulded cable trap.

The overmoulding process may be repeated for additional RF traps as well to yield an electrical cable comprising multiple overmoulded cable traps. As the effectiveness of the RF trap in suppressing shield currents is determined by its location on the electrical cable, i.e., the distance of the RF trap from the ends of the electrical cable and to other RF traps on the same electrical cable, the overmoulded cable trap as disclosed herein helps to provide consistent performance of the RF traps.

Furthermore, a method of fixing the position of an RF trap on an electrical cable by a process of overmoulding is also disclosed herein. The RF trap is placed around a section of the electrical cable, and the RF trap together with the electrical cable is placed into a mould. Using the mould, a thermoplastic material is moulded over the RF trap and the section of the electrical cable, thereby forming an overmoulded cable trap. At the end of the overmoulding process, the overmoulded cable trap is removed from the mould.

Furthermore, an MR system utilizing such an overmoulded cable trap is also disclosed herein.

BRIEF DESCRIPTION OF THE DRAWINGS

These and other aspects will be described in detail hereinafter by way of example on the basis of the following embodiments, with reference to the accompanying drawings, wherein.

Corresponding reference numerals used in the various figures represent corresponding elements in the figures.

DETAILED DESCRIPTION OF EMBODIMENTS

Figure 1:
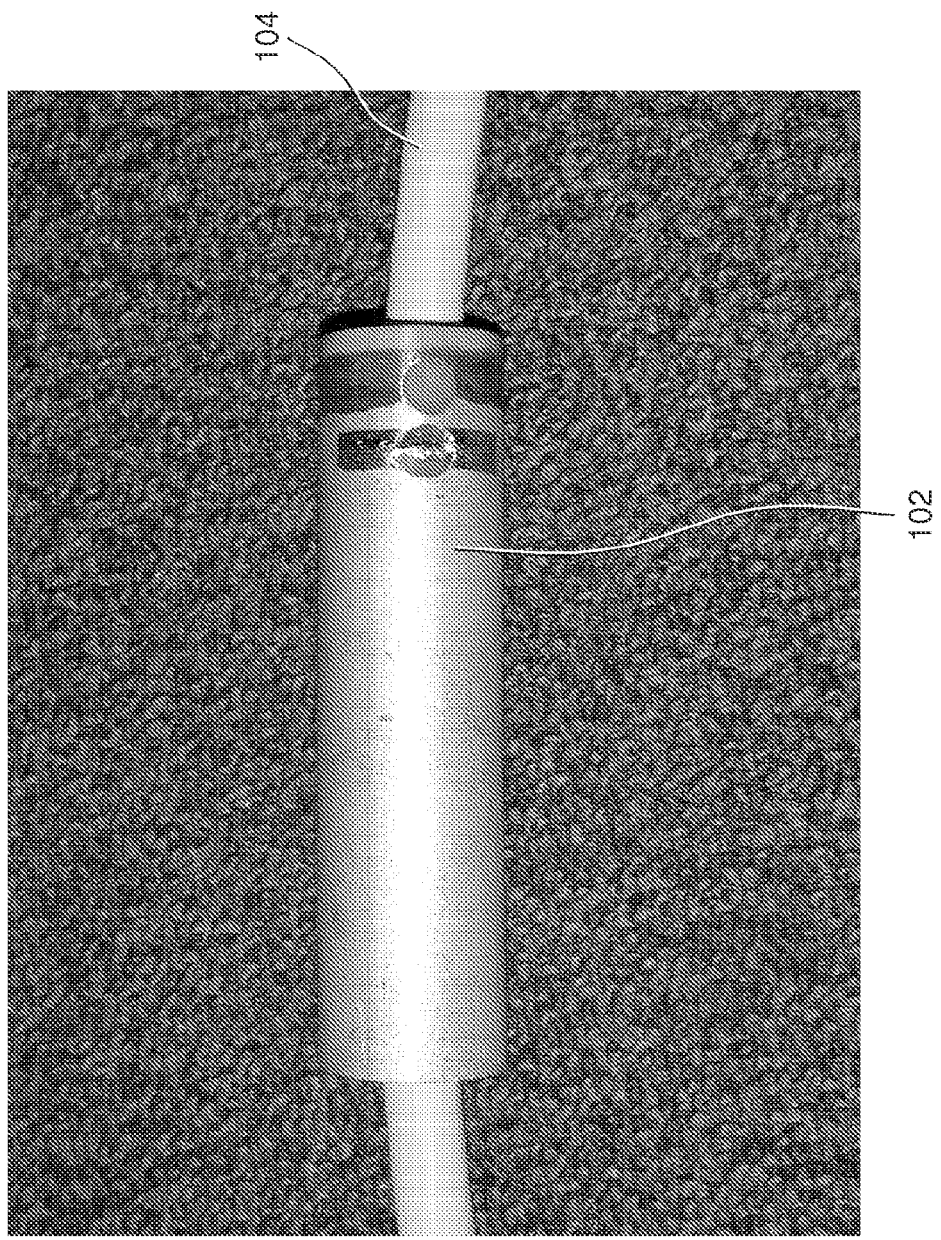
FIG. 1 shows an RF trap placed over an electrical cable.
Figure 2:
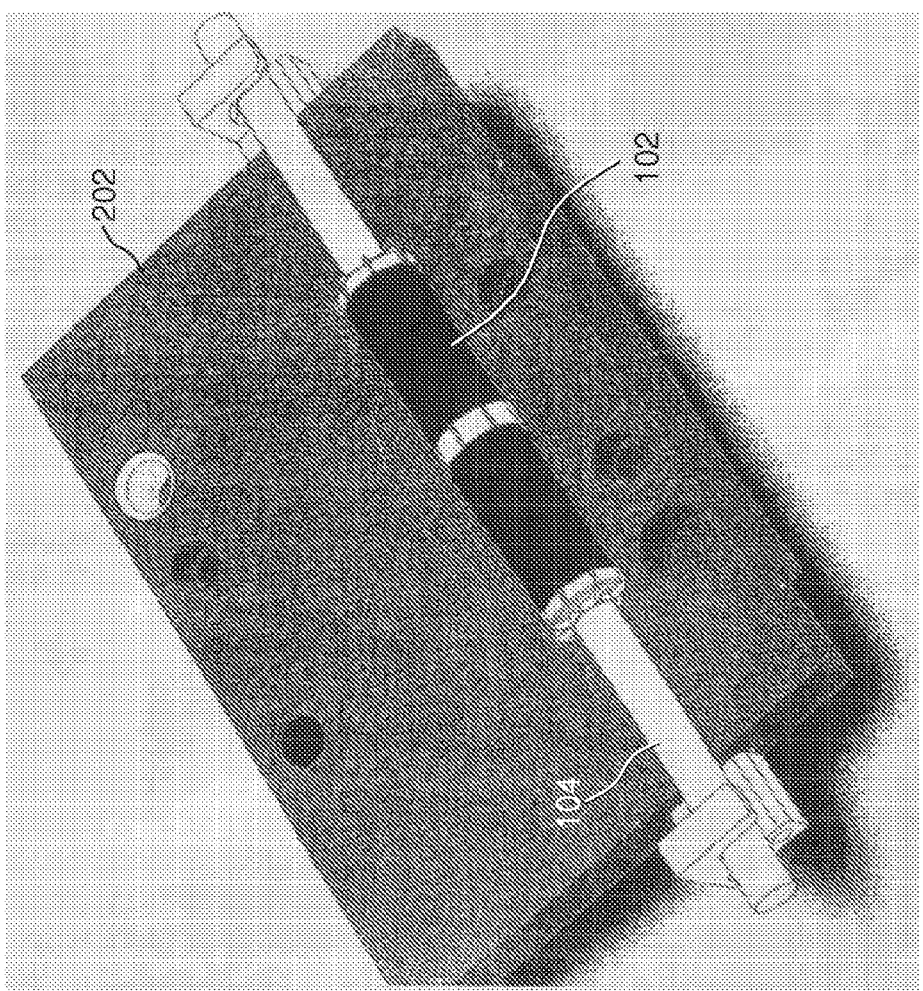
FIG. 2 shows a mould used to make the overmoulded cable trap disclosed herein.
Figure 3:
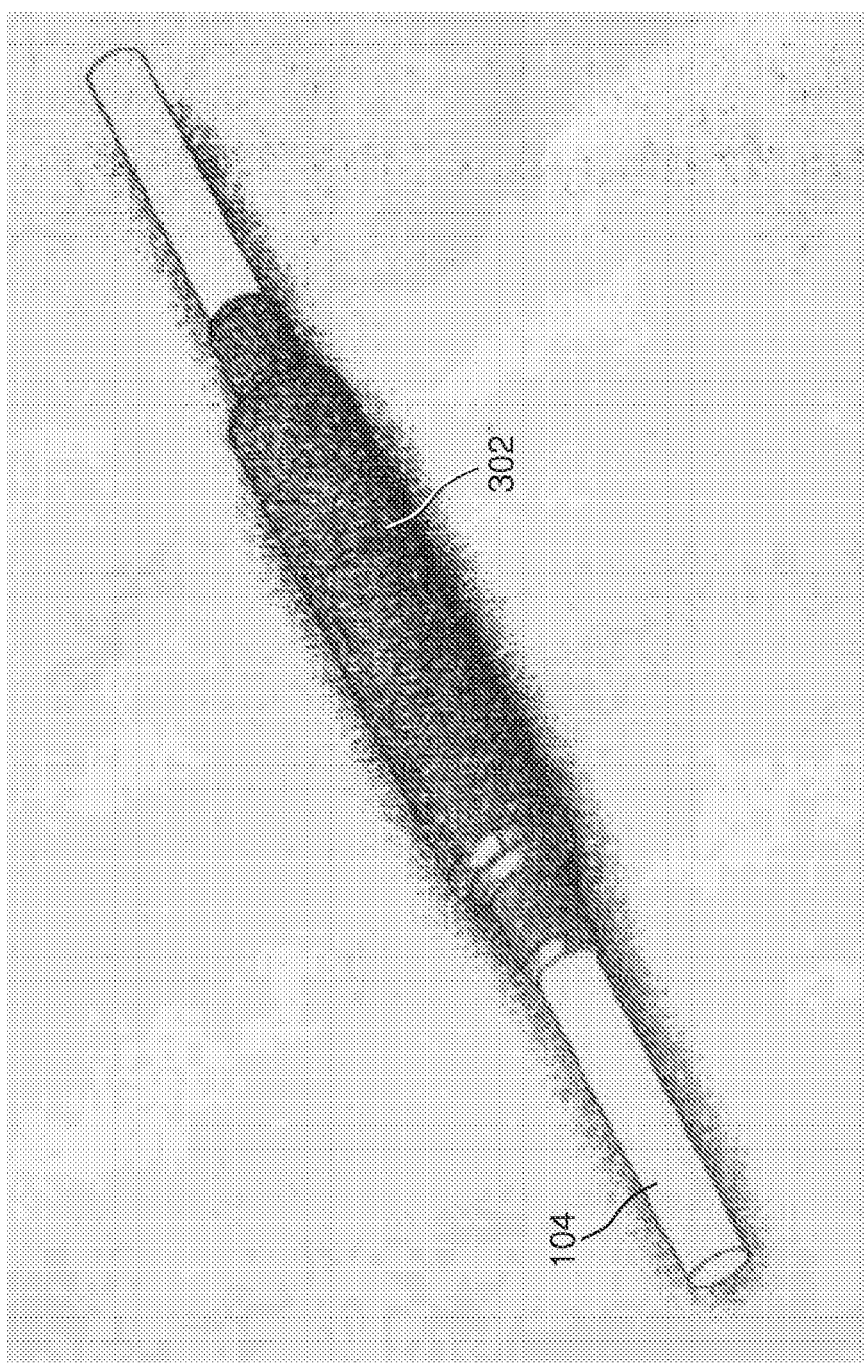
FIG. 3 shows an overmoulded cable trap.

FIG. 1 shows an RF trap 102 placed over an electrical cable 104, FIG. 2 shows an RF trap 102 and an electrical cable 104 placed into a mould 202, and FIG. 3 shows an overmoulded cable trap 302 comprising an RF trap fixed on a section of the electrical cable 104.

In general, the overmoulding process is a thermoforming process that involves applying pressure on a heated plastic sheet using a mould to produce a desired shape. The pressure may be applied either pneumatically (including pressurized air or vacuum), mechanically (using for example, matched molds) or a combination of both. As the thermoplastic material cools, it retains the shape of the mould that was used to form it.

In one implementation of the method, the process involves pre-heating a thermoplastic sheet to within a rated temperature range. The preheated thermoplastic material is then placed into a mould. An RF trap, together with the section of the electrical cable to which the RF trap is to be attached, is also placed into the mould. A second layer of pre-heated thermoplastic material is placed over the RF trap and electrical cable. Then, while the thermoplastic material is still within its rated temperature range suitable for the thermoforming process, the mould is closed and a rated pressure is applied using one of the methods mentioned above, for a rated period of time. The thermoplastic material cools to below the rated temperature range during the rated period of time, after which the overmoulded cable trap, comprising the RF trap and the section of the electrical cable encased in the thermoplastic material, is removed from the mould. The above process may be manual in parts or fully automated. Other moulding processes, for example, injection moulding, or pouring-in of the plastic material, etc., may also be used to form the overmoulded cable trap.

After the overmoulded cable trap is removed from the mould, additional steps may be required to finish the product. For example, scrap material around the edges of the overmoulded cable trap may need to be trimmed. Sanding or other finishing techniques may also be used to smooth the rough edges left behind after the trimming process.

The overmoulding process disclosed herein may be used to fix various types of RF traps. For example, the RF trap may be of a "floating type", i.e., where there is no wired electrical connection between the RF trap 102 and the electrical cable 104. Further information about this type of RF trap may be found in the aforementioned document U.S. Pat. No. 6,605,775B1. Alternatively, the RF trap may also be of a "fixed type", wherein the RF trap is directly electrically connected to the line to be shielded. Further information about this type of RF trap may be found in the document U.S. Pat. No. 5,742, 165B2. In either of the above cases, the RF trap may be fixed in position on the electrical cable by overmoulding a thermoplastic material over both the RF trap and the electrical cable.

The RF trap may partially or completely surround the electrical cable. Though RF traps are commonly circular in cross-section, it is possible to have RF traps of other cross-sectional shapes, such as square, rectangular, or triangular as well.

The overmoulding process is suitable for fixing RF traps made of ceramic materials. However, not all ceramic materials, including some of those commonly used in making RF traps, are suitable for making the cable trap disclosed herein. Most ceramic materials have a small magnetic susceptibility, which may exceed permissible limits for use within an MR suite. Also, many ceramic materials do not have a permittivity that is stable with changes in temperature. Furthermore for use in typical MRI applications, the ceramic material must not give out an MR signal at or near the proton frequency, which is around 64 MHz at 1.5 T. The ceramic material must also be non-magnetic.

In brief, a ceramic material that satisfies the following requirements may be used in making RF traps for an MR application:

a. The ceramic material must have a low magnetic susceptibility that causes only minimal distortion of the $B_0$ field in the region of interest, for example, a part of the anatomy of a patient being imaged. For example, the $B_0$ distortion introduced is less than 0.5 parts-per-million (ppm), and preferably less than 0.25 ppm. Ceramic materials producing larger or smaller distortion levels may also work, though at different levels of effectiveness.

b. A permittivity value that is stable over a range of temperatures, for example between 0° C. and 80° C. An acceptable permittivity value is 5 ppm for a ceramic material that may be used in making a suitable RF trap. Even a permittivity value of 0 ppm per degree Celsius is achievable, and such ceramic materials may also be used in making suitable RF traps. The practical limit of permittivity value of a ceramic material for making an RF trap for use in an MR environment is about 100 ppm/° C.

c. No detectable MR signal at or around the proton resonance frequency (e.g., 64 MHz at 1.5 T, 128 MHz at 3 T, etc.).

d. The ceramic material must be non-magnetic.

It is an insight of the inventors that only certain ceramics that meet all the above requirements can be used in the MR environment.

Certain classes of ceramic materials, for example, metal oxides, have a positive magnetic susceptibility while some others have a small negative magnetic susceptibility. Materials with a positive value are called paramagnetic materials and materials with a negative value are called diamagnetic materials. The ceramic materials that can be considered for making RF traps are usually composite materials, formed by combination of one or more of the paramagnetic and diamagnetic ceramic materials. Specifically, to get a low resultant susceptibility (may even be around zero ppm), it may be required to mix one or more ceramics with positive susceptibility values with one or more ceramic materials with negative values. Currently, only ceramic materials having low negative values for susceptibility exist; therefore, only materials with low positive values for susceptibility are used to make a mix that will result in a susceptibility of about zero for the composite material.

Some ceramic materials with high positive values of susceptibility, for example, oxides that contain Neodymium or Samarium, may impart good electrical properties (for example, permittivity values that are stable with temperature or a high value for the permittivity, etc.) to a composite material, but they cannot be used in an MR environment as they could cause unacceptable distortions in the Bo magnetic field.

Materials such as Titanium-oxide, Calcium-oxide, Barium-oxide, and Strontium-oxide have positive values of magnetic susceptibility that are sufficiently low to be compensated by the above-mentioned materials with low negative values of magnetic susceptibility. The materials with positive and negative values of magnetic susceptibility may need to be mixed in a certain proportion, which may be related to the volume of the overmoulded cable trap that is desired, in the composite material to properly compensate each other's magnetic susceptibility.

Examples of ceramic materials that can be used for making RF traps for use within the MR suite include, for example, D36 from Morgan Electrocermics™; E6000 and E5080 from Temex™; Capinvar, Faradite and K5000 from SCT (Sociéte dés Céramiques Techniques)™; and K1700 from Kyocera™.

The overmoulding procedure is dependent on the type of thermoplastic polymer used, and is known in the art. The thermoplastic material should preferably not generate a proton signal during normal MR data acquisition. In the case of multi-nuclear MR imaging or spectroscopy, it is preferable that the thermoplastic material does not generate a signal at or around the frequency of the nucleus or nuclei under investigation. It is also preferable that the selected thermoplastic material conforms to the biocompatibility requirements according to ISO 109331. Examples of thermoplastic materials that may be used for the overmoulding process disclosed herein are Desmopan® thermoplastic polyurethanes (TPU) (Bayer Material Science—http://polymers-usa.bayer.com/products/index.cfm) and Polyether Polyurethane type 22-PUR85/HF from Dupont™ (http://polymers-usa .bayer-.com/products/index.cfm). Desmopan® TPUs have mechanical properties that fall between those of rubber and plastics, and are available in a range from very soft and flexible to very hard and rigid. Other exemplary materials include Zytel® EMX505 and Zytel® FE5382 BK276, also from DuPont™, which are strong, mouldable materials that provides effective shielding from environmental factors. The latter, which is a 33% glass fiber reinforced, heat stabilized, black polyamide 612 resin developed for electrical bobbins and encapsulation applications, may be especially suited for forming the disclosed cable trap.

The mould may be made of a metal such as aluminum or steel. The mould may also be made from a sprayed metal shell such as aluminum, copper, nickel, tin, or zinc impregnated with resin for enhanced rigidity. It may also be possible to use moulds made of plastic or wood. The choice of material for the mould is dictated by the type of thermoplastic material used, as the mould will have to withstand a certain temperature and pressure during the overmoulding process. Another consideration for choice of material for the mould could be the life expectancy of the mould. The criteria for selection of mould material is similar to the criteria outlined above for selection of a suitable thermoplastic material.

Within an MR suite, an RF trap is required especially for cables that are connected to RF transmit and receive coils, especially of the planar type (also called as "surface coils"). During a standard imaging procedure, the RF surface coils are manually handled by an operator for each patient scan, and there is a likelihood that the cables connecting the RF surface coils may come in contact with the MR system, the operator and/or the patient. The RF trap must therefore be designed such that sharp edges are minimized. Furthermore, electrical contact between the patient or operator and the trap is not allowed, as there is a risk of electrical shock to the patient or operator. The overmoulded cable trap disclosed herein is made to have a smooth surface, thereby enhancing safety. Also, the smooth rounded edges of the RF trap ensure that it does not catch on the tabletop (i.e., the top of the patient transport table) or other parts of the MR apparatus, when the cable or the coil is moved. Furthermore, the thermoplastic material used for overmoulding insulates the patient or operator from the RF trap, thereby further enhancing safety.

When an electrical cable with an RF trap is being handled by an operator, there is a likelihood of moisture from the operator's hands coming in contact with an exposed RF trap. There is also a chance of exposure to ambient moisture, or moisture from a patient's skin. Any of the above can affect the performance of the RF trap. Overmoulding the RF trap and the cable with a thermoplastic material increases the resistance to moisture, and ensures safe and reliable operation. The overmoulded cable trap is also less susceptible to mechanical shock and can be cleaned easily, which is also important in a hospital environment.

The overmoulding process may be applied irrespective of the diameter of the cable trap and/or cable being overmoulded. The overmoulding process gives a better fixation of the RF trap on the electrical cable, which results in improved suppression of voltage spikes caused by extraneous EM radiation.

The overmoulding process also reduces cost of manufacture of such cable traps as disclosed herein. Compared to traditional methods of providing a defensive environmental barrier like potting, wherein an electronic component is encapsulated in an epoxy or urethane filler housing, or conformal coating, wherein layers of protective chemicals are sprayed on the electronic component, overmoulding is less expensive, less wasteful, and provides better protection.

Thus, the overmoulded cable trap disclosed herein provides an RF trap that has better shock protection, increased resistance to moisture, improved smoothness, is easier to handle and clean, is cheaper, can be created in very small packages where space is limited, can easily be sized to suit a range of diameters and lengths, is more reliable with respect to maximum rated voltage and less EM coupling to the environment, and generates less heat, than other designs of RF traps.

Figure 4:
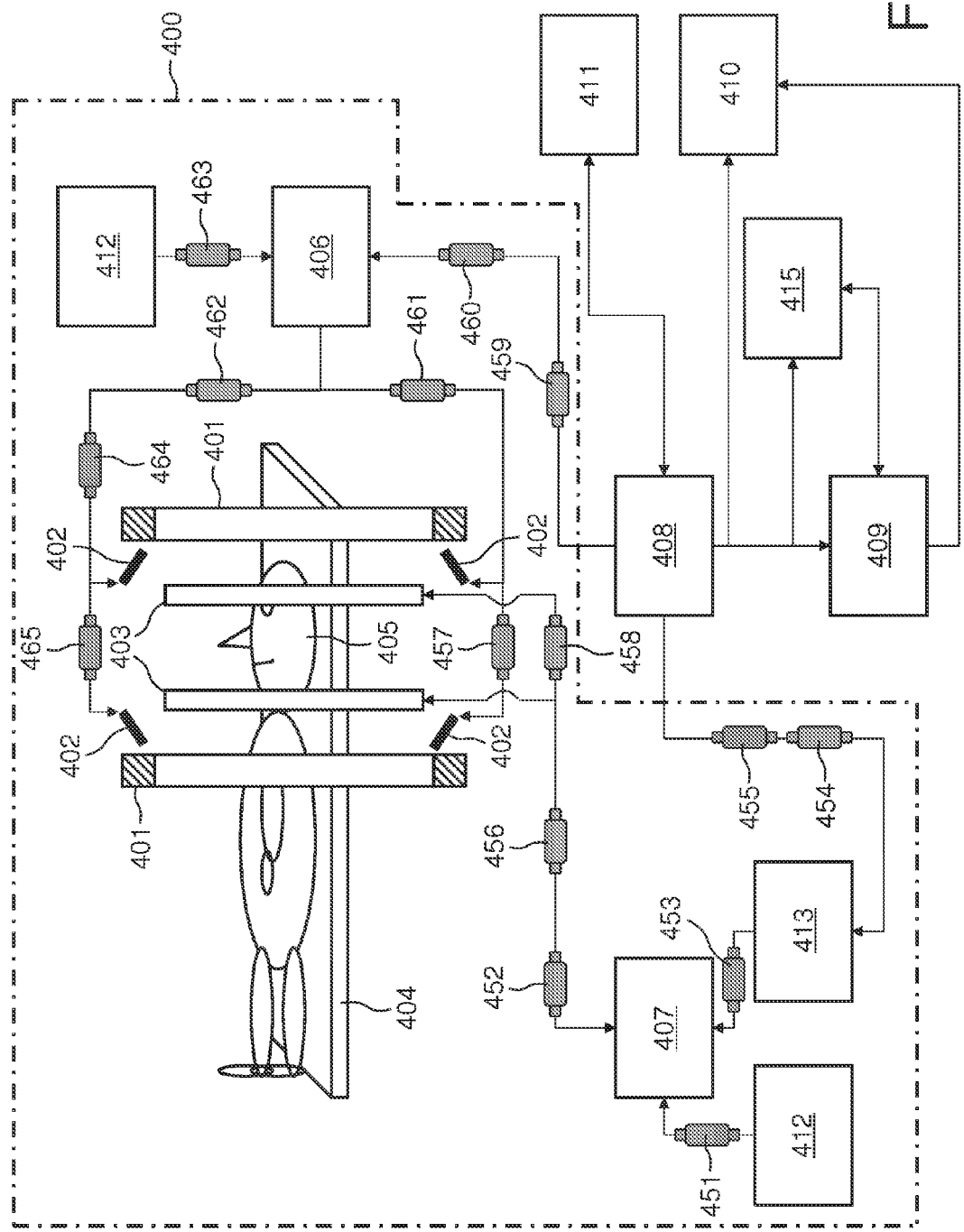
FIG. 4 schematically shows an MR system utilizing the overmoulded cable trap.

FIG. 4 shows a possible embodiment of an MR system utilizing the overmoulded cable trap disclosed herein. The MR room 400 houses the MR system comprising a set of main coils 401, multiple gradient coils 402 connected to a gradient driver unit 406, and RF coils 403 connected to an RF coil driver unit 407. The function of the RF coils 403, which may be integrated into the magnet in the form of a body coil, or may be separate surface coils, is further controlled by a transmit/receive (T/R) switch 413. The multiple gradient coils 402 and the RF coils are powered by a power supply unit 412. A transport system 404, for example a patient table, is used to position a subject 405, for example a patient, within the MR imaging system. A control unit 408 controls the RF coils 403 and the gradient coils 402. The control unit 408, though shown as a single unit, may be implemented as multiple units, with some units placed inside the MR room 400 and other units placed outside. The control unit 408 further controls the operation of a reconstruction unit 409. The control unit 408 also controls a display unit 410, for example a monitor screen or a projector, a data storage unit 415, and a user input interface unit 411, for example, a keyboard, a mouse, a trackball, etc. The electrical cables interconnecting the various components inside the MR room 400 utilize overmoulded cable traps 451-465 as disclosed herein, to reduce unwanted RF interference in the electrical cables.

The main coils 401 generate a steady and uniform static magnetic field, for example, of field strength 1 T, 1.5 T or 3 T. The disclosed overmoulded cable trap is applicable to other field strengths as well. The main coils 401 are arranged in such a way that they typically enclose a tunnel-shaped examination space, into which the subject 405 may be introduced. Another common configuration comprises opposing pole faces with an air gap in between them into which the subject 405 may be introduced by using the transport system 404. To enable MR imaging, temporally variable magnetic field gradients superimposed on the static magnetic field are generated by the multiple gradient coils 402 in response to currents supplied by the gradient driver unit 406. The power supply unit 412, fitted with electronic gradient amplification circuits, supplies currents to the multiple gradient coils 402, as a result of which gradient pulses (also called gradient pulse waveforms) are generated. The control unit 408 controls the characteristics of the currents, notably their strengths, durations and directions, flowing through the gradient coils to create the appropriate gradient waveforms. The RF coils 403 generate RF excitation pulses in the subject 405 and receive MR signals generated by the subject 405 in response to the RF excitation pulses. The RF coil driver unit 407 supplies current to the RF coil 403 to transmit the RF excitation pulse, and amplifies the MR signals received by the RF coil 403. The transmitting and receiving functions of the RF coil 403 or set of RF coils are controlled by the control unit 408 via the T/R switch 413. The T/R switch 413 is provided with electronic circuitry that switches the RF coil 403 between transmit and receive modes, and protects the RF coil 403 and other associated electronic circuitry against breakthrough or other overloads, etc. The characteristics of the transmitted RF excitation pulses, notably their strength and duration, are controlled by the control unit 408.

It is to be noted that though the transmitting and receiving coil are shown as one unit in this embodiment, it is also possible to have separate coils for transmission and reception, respectively. It is further possible to have multiple RF coils 403 for transmitting or receiving or both. The RF coils 403 may be integrated into the magnet in the form of a body coil, or may be separate surface coils. They may have different geometries, for example, a birdcage configuration or a simple loop configuration, etc. The control unit 408 is preferably in the form of a computer that includes a processor, for example a microprocessor. The control unit 408 controls, via the T/R switch 413, the application of RF pulse excitations and the reception of MR signals comprising echoes, free induction decays, etc. User input interface devices 411 like a keyboard, mouse, touch-sensitive screen, trackball, etc., enable an operator to interact with the MR system.

The MR signal received with the RF coils 403 contains the actual information concerning the local spin densities in a region of interest of the subject 405 being imaged. The received signals are reconstructed by the reconstruction unit 409, and displayed on the display unit 410 as an MR image or an MR spectrum. It is alternatively possible to store the signal from the reconstruction unit 409 in a storage unit 415, while awaiting further processing. The reconstruction unit 409 is constructed advantageously as a digital image-processing unit that is programmed to derive the MR signals received from the RF coils 403.

Figure 5:
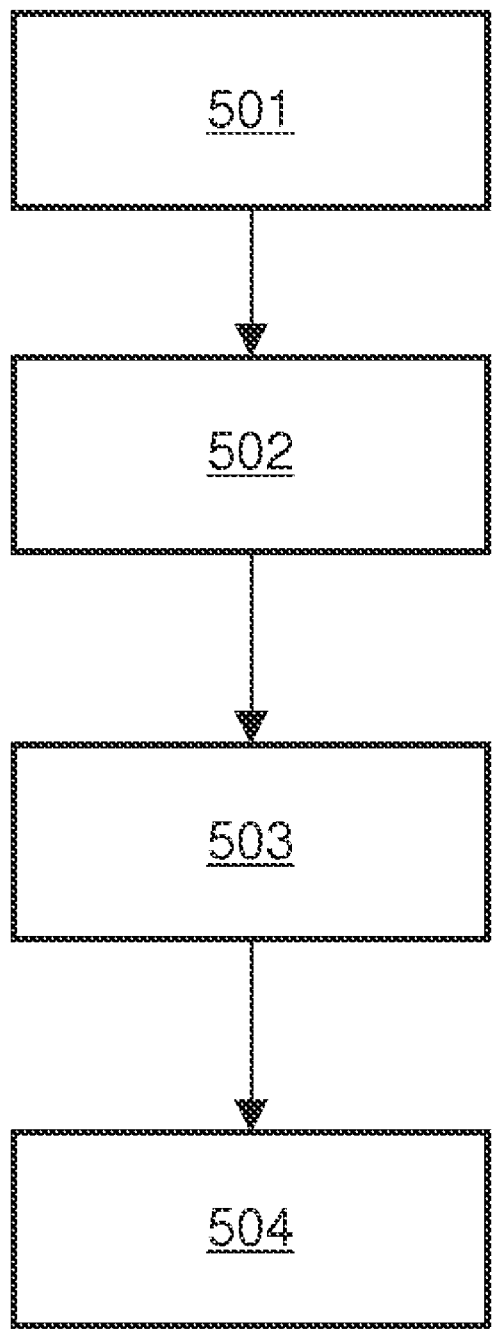
FIG. 5 illustrates a method of producing the overmoulded cable trap.

FIG. 5 illustrates a method of fabricating an overmoulded cable trap, the method comprising a step 501 of placing an RF trap on a section of an electrical cable, a step 502 of placing both the RF trap and the section of the electrical cable into a mould, a step 503 of overmoulding a thermoplastic material over both the RF trap and the section of the electrical cable to yield an overmoulded cable trap, and a step 504 of removing the overmoulded cable trap from the mould.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage. The order in the described embodiments of the disclosed method is not mandatory. A person skilled in the art may change the order of steps or perform steps concurrently using multiple processes without departing from the disclosed concepts.

The invention claimed is:

1. A cable trap comprising a section of an electrical cable and an RF trap, wherein the RF trap is made of a magnetic resonance-compatible ceramic material, wherein the RF trap is fixed in position on the section of the electrical cable by overmoulding a thermoplastic material over both the RF trap and the section of the electrical cable.

2. The cable trap of claim 1, wherein the RF trap and the section of the electrical cable are encapsulated in the thermoplastic material.

3. The cable trap of claim 1, wherein the RF trap includes a layer of the ceramic material around the cable.

4. The cable trap of claim 1, wherein the RF trap is a floating-type in which there is no wired connection between the RF trap and the electrical cable.

5. The cable trap of claim 4, wherein the ceramic material is a combination of paramagnetic and diamagnetic ceramic materials.

6. The cable trap of claim 1, wherein the ceramic material is a combination of paramagnetic and diamagnetic ceramic materials.

7. The cable trap of claim 6, wherein the paramagnetic and the diamagnetic ceramic materials are mixed such that the magnetic resonance compatible ceramic material has a substantially zero or very low susceptibility.

8. The cable trap of claim 1, wherein the magnetic resonance compatible material has a low magnetic susceptibility and includes a combination fo positive magnetic susceptibility ceramic material and negative magnetic susceptibility ceramic material.

9. The cable trap of claim 1, wherein the magnetic resonance compatible material includes:
    an oxide of Neodymium or Samarium; and
    an oxide of Titanium, Calcium, Barium, or Strontium.

10. The cable trap of claim 1, wherein the thermoplastic material of the overmoulding does not generate a proton signal during an MR acquisition and is biocompatible.

11. The cable trap of claim 10, wherein the overmoulding has a smooth surface and rounded corners such that the trap does not catch on a table top.

12. A magnetic resonance system including a cable trap comprising a section of an electrical cable and an RF trap, wherein the RF trap includes a ceramic material adjacent to and not wire connected to the electrical cable and is fixed in position on the section of the electrical cable by overmoulding a thermoplastic material over both the RF trap and the section of the electrical cable.

13. The magnetic resonance system of claim 12, wherein the ceramic material is a combination of paramagnetic and diamagnetic ceramic materials.

14. A method of fabricating an overmoulded cable trap, comprising:
    placing a magnetic resonance compatible ceramic material of an RF trap adjacent a section of an electrical cable without a wired connection to the electrical cable;
    placing both the magnetic resonance compatible ceramic material of the RF trap and the section of the electrical cable into a mould;
    overmoulding a thermoplastic material over both the magnetic resonance compatible ceramic material of the RF trap and the section of the electrical cable to yield an overmoulded cable trap; and
    removing the overmoulded cable trap from the mould.

15. The method of claim 14, wherein the ceramic material is a combination of paramagnetic and diamagnetic ceramic materials.

16. The method of claim 14, wherein the thermoplastic material of the overmoulding does not generate a proton signal during an MR acquisition and is biocompatible.

17. The method of claim 14, wherein the overmoulding has a smooth surface and rounded corners such that the trap does not catch on a table top.

\* \* \* \* \*